United States Patent
Lee et al.

(10) Patent No.: US 7,254,028 B2
(45) Date of Patent: Aug. 7, 2007

(54) HEAT DISSIPATING DEVICE WITH BACK PLATE FOR ELECTRONIC ASSEMBLY

(75) Inventors: Hsieh-Kun Lee, Tu-Cheng (TW); Chun-Chi Chen, Tu-Cheng (TW); Shin-Hsuu Wung, Tu-Cheng (TW); Yu Huang, Shenzhen (CN)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 115 days.

(21) Appl. No.: 11/269,379

(22) Filed: Nov. 8, 2005

(65) Prior Publication Data

US 2006/0279933 A1     Dec. 14, 2006

(30) Foreign Application Priority Data

Jun. 13, 2005    (CN)    ................. 2005 2 0060034

(51) Int. Cl.
    *H05K 7/20*    (2006.01)
(52) U.S. Cl. .............. 361/704; 361/719; 257/718; 257/719; 165/80.3; 174/16.3
(58) Field of Classification Search ................ 361/703, 361/704, 705–712, 714–720; 257/706–719, 257/722–727; 174/16.3, 252; 165/80.3, 165/185; 248/505, 510; 24/297, 508, 457, 24/458
See application file for complete search history.

(56) References Cited

U.S. PATENT DOCUMENTS

| 6,055,159 | A  | 4/2000  | Sun |
| 6,480,388 | B1 | 11/2002 | Lee et al. |
| 6,549,412 | B1 | 4/2003  | Ma |
| 6,560,112 | B1 | 5/2003  | Szu et al. |
| 6,560,113 | B1 | 5/2003  | Ma |
| 6,611,431 | B1 | 8/2003  | Lee et al. |
| 6,654,254 | B2 | 11/2003 | Szu et al. |
| 6,692,192 | B2 * | 2/2004 | Poldervaart .................. 405/224 |
| 6,778,396 | B2 | 8/2004  | Liu |
| 6,789,312 | B2 * | 9/2004 | White .......................... 29/832 |
| 6,826,054 | B2 | 11/2004 | Liu |
| 6,858,792 | B2 * | 2/2005 | Franz et al. ................ 174/16.1 |
| 6,885,557 | B2 | 4/2005  | Unrein |
| 7,126,823 | B2 * | 10/2006 | Chen et al. .................. 361/702 |

(Continued)

Primary Examiner—Michael Datskovskiy
(74) Attorney, Agent, or Firm—Morris Manning & Martin LLP; Tim Tingkang Xia, Esq.

(57) ABSTRACT

An electronic assembly includes a PCB (20), a socket (22) mounted on the PCB, a CPU (24) connected with the socket, a heat sink (10) in thermal contact with the CPU, a foldable back plate (30) attached to an underside of the PCB and a base plane (40) forming four bridges (42). The back plate includes a first piece section (32) and a second piece section (34) pivotally joined together by a pivot (36). The first and the second piece sections each comprise two legs inserted into two corresponding bridges. Screws are used to extend through the heat sink, the PCB, the bridges to threadedly engage with the legs of the back plate, respectively. The pivot is located under a part of the PCB at which the CPU is mounted.

20 Claims, 5 Drawing Sheets

U.S. PATENT DOCUMENTS 7,142,430 B2 * 11/2006 Lee et al. .................. 361/719
7,190,586 B2 * 3/2007 Franz et al. ............... 361/704
7,190,591 B2 * 3/2007 Peng et al. ................ 361/719

* cited by examiner

HEAT DISSIPATING DEVICE WITH BACK PLATE FOR ELECTRONIC ASSEMBLY

BACKGROUND

1. Field

The present invention relates to a heat dissipating device to dissipate heat generated by an electrical component in a computer system, and more particularly to a heat dissipating device which has a back plate for strengthening a printed circuit board in the computer system.

2. Prior Art

As computer technology continues to advance, electronic components such as central processing units (CPUs) of computers are made to provide faster operational speeds and greater functional capabilities. When a CPU operates at a high speed in a computer, its temperature frequently increases greatly. Therefore, a heat dissipating device is widely used to remove heat from a CPU of a computer. FIGS. 4-6 illustrate an electronic assembly including a conventional heat dissipating device for a CPU 2 of a computer. As shown, a printed circuit board 4 (PCB) has a top side provided with an integrated circuit socket 3 for establishing electrical connection with the CPU 2. The heat dissipating device comprises a heat sink 1 attached to the CPU 2. The heat dissipating device further comprises a back plate 5 disposed below the printed circuit board 4 for mounting of the heat sink 1 and strengthening the printed circuit board 4 to reduce a deformation thereof. Bolts 6 are extended through the heat sink 1, the printed circuit board 4 and the back plate 5, and respectively threadedly engaged with nuts 7, respectively. The electronic assembly including the heat dissipating device is thus fixed together.

However, as shown in FIG. 5 and FIG. 6, since the back plate 5 is formed of a thin metal sheet and the heat sink 1 is made larger and larger (which means heavier and heavier), the conventional back plate 5 is no longer strong enough to strengthen the printed circuit board 4 to stand a weight of the heat sink 1 acting on the CPU 2 and accordingly the PCB 4. As a result, a portion of the printed circuit board 4 below the CPU 2 is deformed downwardly as shown in FIG. 6, which shows the deformation in an exaggerative manner. Such a deformation may adversely affect electrical connection between the CPU 2 and the printed circuit board 4. Furthermore, since the back plate 5 is not foldable, to transport or store it needs a large space.

Consequently, there is a need in the art to provide a back plate which can sufficiently strengthen the printed circuit board and which is foldable.

SUMMARY

Accordingly, what is needed is a heat dissipating device which has a back plate which is strong enough to support a printed circuit board against weight of a heat sink, and which is foldable so that it can be folded during storage or transportation.

According to an embodiment of the present invention, an electronic assembly comprises a printed circuit board, a socket mounted on the printed circuit board, a CPU connected with the socket, and a heat dissipating device. The heat dissipating device comprises a heat sink in thermal contact with the CPU, a foldable back plate attached to an underside of the printed circuit board opposite the CPU and a base plane assembled to the back plate. The back plate comprises a first piece section and a second piece section pivotally joined together by a pivot. The first and the second piece sections each comprise a flat base portion and a projecting portion extending from the flat base portion. The two projecting portions cooperatively abut against the underside of the printed circuit board to thereby prevent the printed circuit board from being deformed due to weight of the heat sink. When the back plate is disassembled from the printed circuit board, the back plate can be folded to reduce occupied space, thereby to facilitate shipment and storage thereof.

Other advantages and novel features of the present invention will become more apparent from the following detailed description when taken in conjunction with the accompanying drawings, in which:

DETAILED DESCRIPTION OF THE PREFERRED EMBODIMENT

Figure 1:
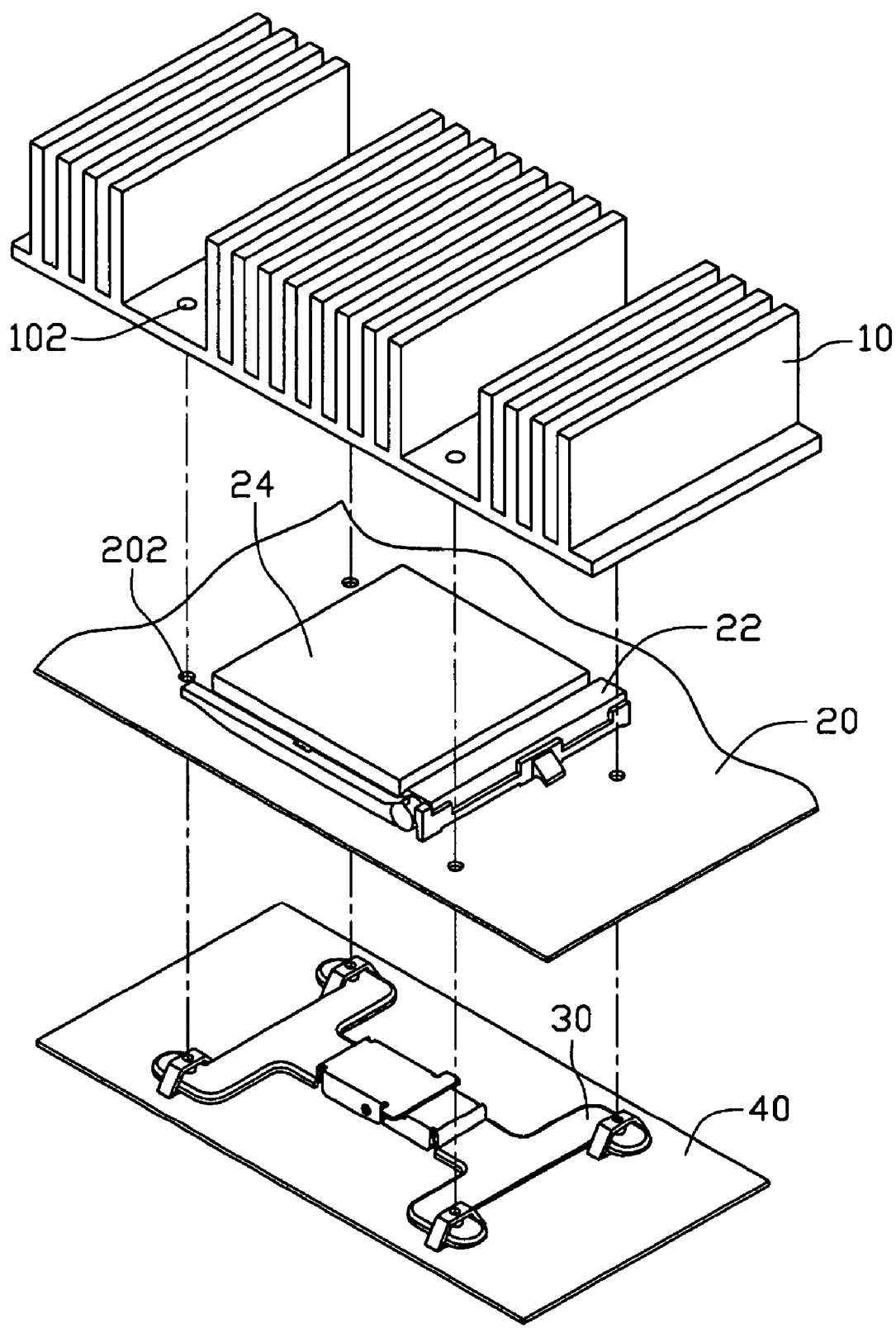
FIG. 1 is a perspective, exploded view of an electronic assembly including a heat dissipating device in accordance with a preferred embodiment of the present invention.

FIG. 1 shows an electronic assembly including a heat dissipating device in accordance with a preferred embodiment of the present invention. The electronic assembly includes the heat dissipating device, a printed circuit board (PCB) 20, a socket 22 mounted on the PCB 20 and a CPU 24 mounted on the socket 22. The heat dissipation device comprises a base plan 40 which is a part of an enclosure of a computer, a heat sink 10 and a back plate 30. The printed circuit board 20 defines four through holes 202 at four corners of the socket 22, respectively. The heat sink 10 has a bottom mating face for contacting the CPU 24. The heat sink 10 defines four fixing holes 102 therein, corresponding to the through holes 202.

Figure 2:
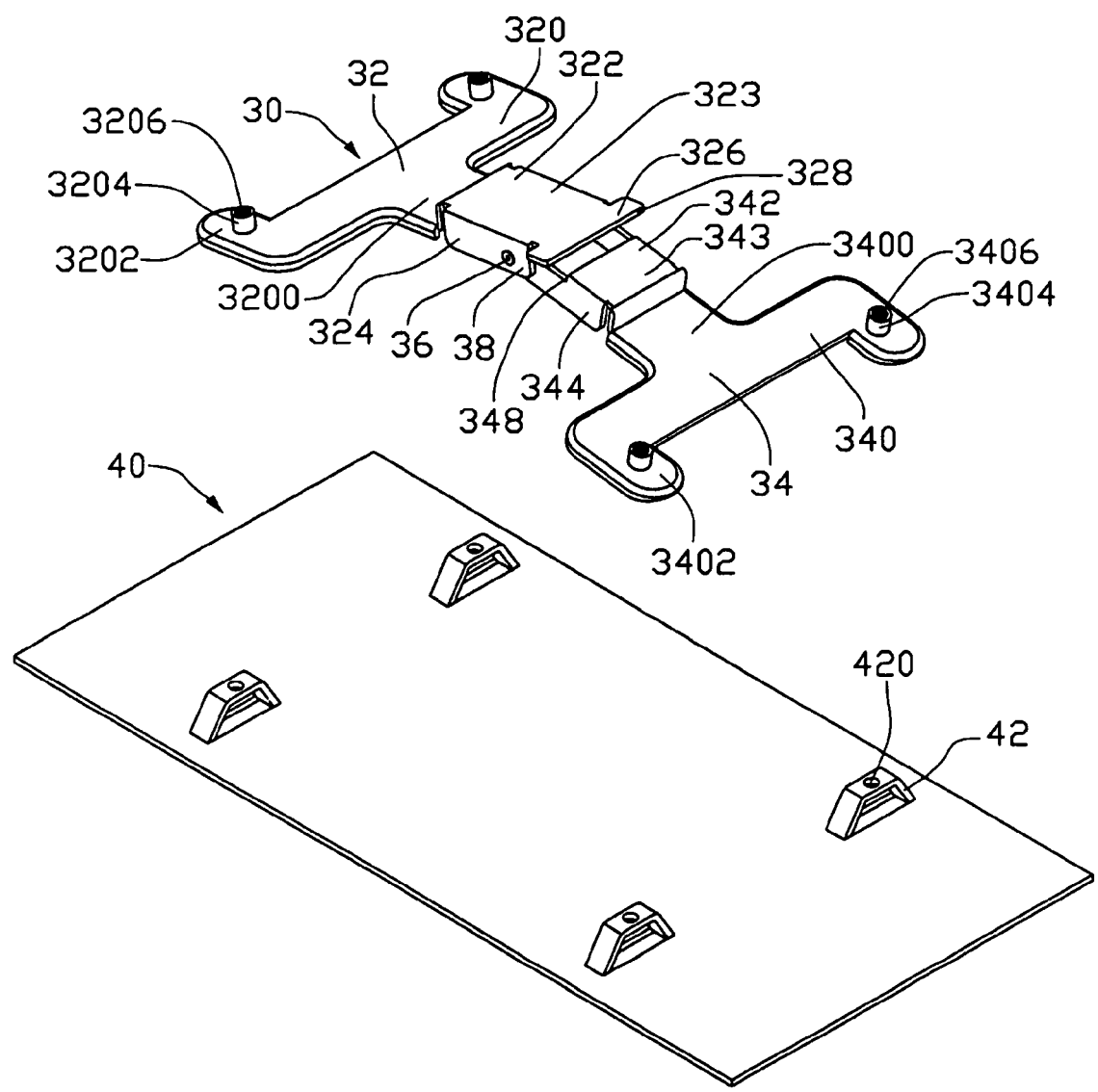
FIG. 2 is a perspective, exploded view of a back plate and a base plane of the heat dissipating device of FIG. 1.

Referring to FIG. 2, the back plate 30 comprises a first piece section 32 and a second piece section 34 pivotally joined together by a pivot 36. The back plate 30 is foldable to a position that the first piece section 32 is over the second piece section 34 thereby reducing occupied space of the back plate 30. The first piece section 32 and the second piece section 34 respectively comprise flat bases 320, 340 and projecting portions 322, 342. Each of the bases 320, 340 comprises a flange 3200, 3400 and a pair of legs 3202, 3402 horizontally extending outwardly from respective two lateral sides thereof. Posts 3204, 3404 extend upwardly from the legs 3202, 3402, each post having an aperture 3206, 3406 defining an internal thread thereon. Each of the projecting portions 322, 342 extends from an end of the flange 3200, 3400. The projecting portions 322, 342 each form a contact portion 323, 343 for contacting an underside of the printed circuit board 20, and a pair of lateral sides 324, 344 perpendicularly extending downwardly from opposite sides thereof. The contact portion 323 is parallel to the flat base 320 and forms an operating portion 326 horizontally extending therefrom. The operating portion 326 forms an edge 328 at an end thereof. The contact portion 343 is parallel to the flat base 340 and forms an edge portion 348 at an end thereof. The operating portion 326 is positioned on the lateral sides 344 of the projecting portion 342 extending below the contact portion 323. The edge 328 of the operating portion 326 abuts against the edge portion 348 of the contact portion 343 when the back plate 30 is extended flat. The lateral sides 324, 344 form an overlapped portion 38. The pivot 36 is inserted in the overlapped portion 38.

The base plane 40 is formed by stamping a metal sheet. Four arch bridges 42 extend upwardly from the base plane 40. A locating hole 420 is defined in each of the arch bridges 42, corresponding to a respective one of the apertures 3206, 3406 when the back plate 30 is mounted to the base plane 40.

Figure 3:
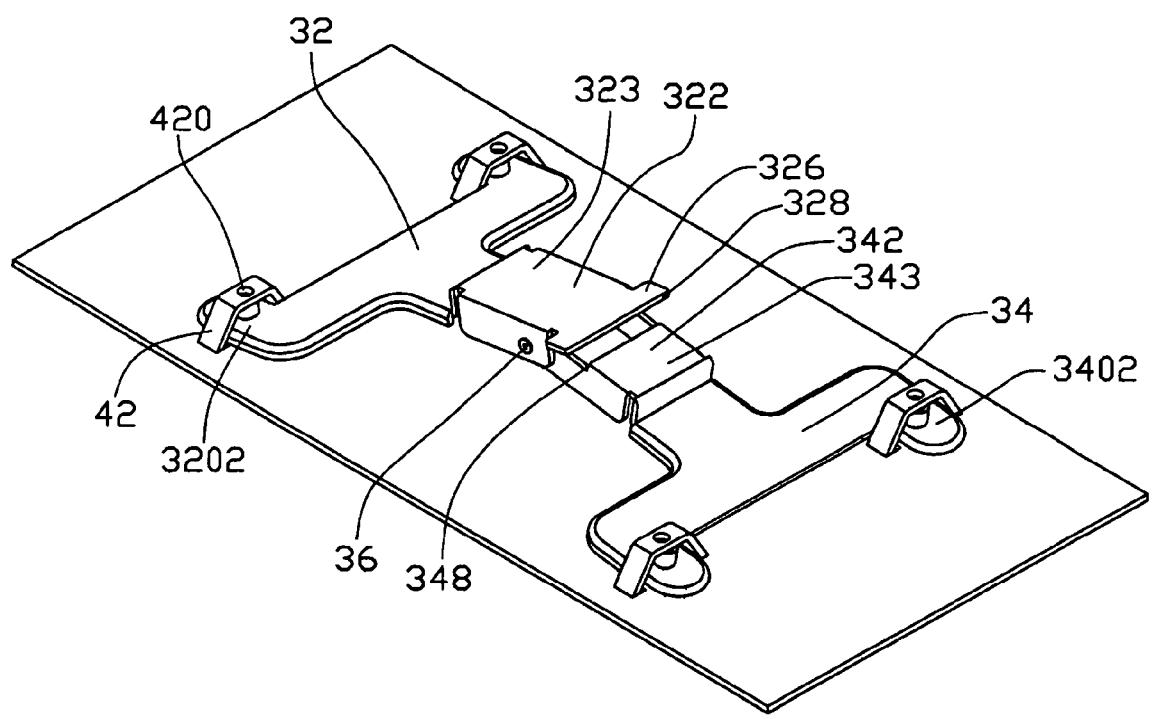
FIG. 3 is an assembled view of FIG. 2.
Figure 4:
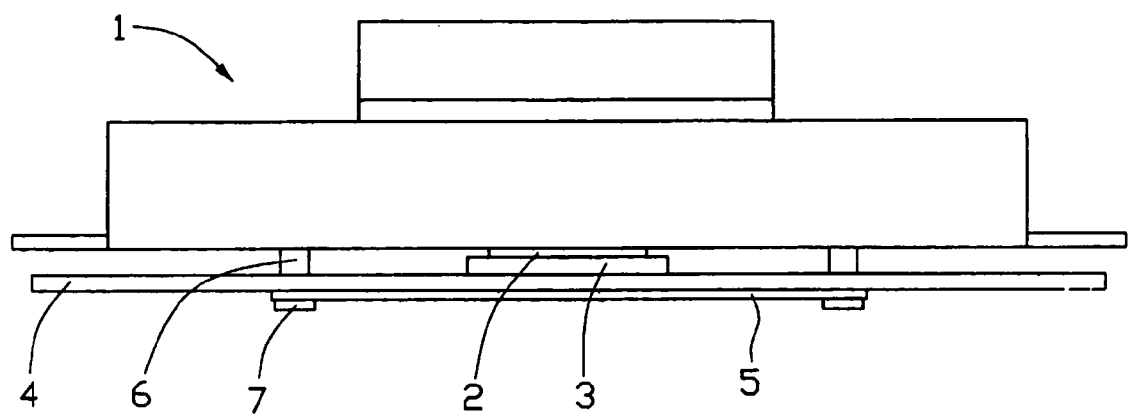
FIG. 4 is a schematic side plan view of an electronic assembly including a conventional heat dissipating device.
Figure 5:
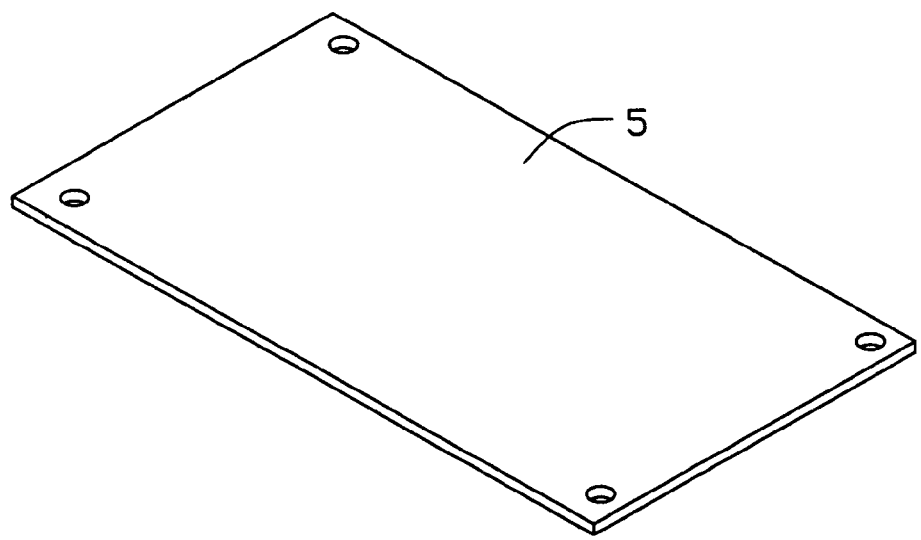
FIG. 5 is a perspective view of a back plate of the heat dissipating device of FIG. 4.
Figure 6:
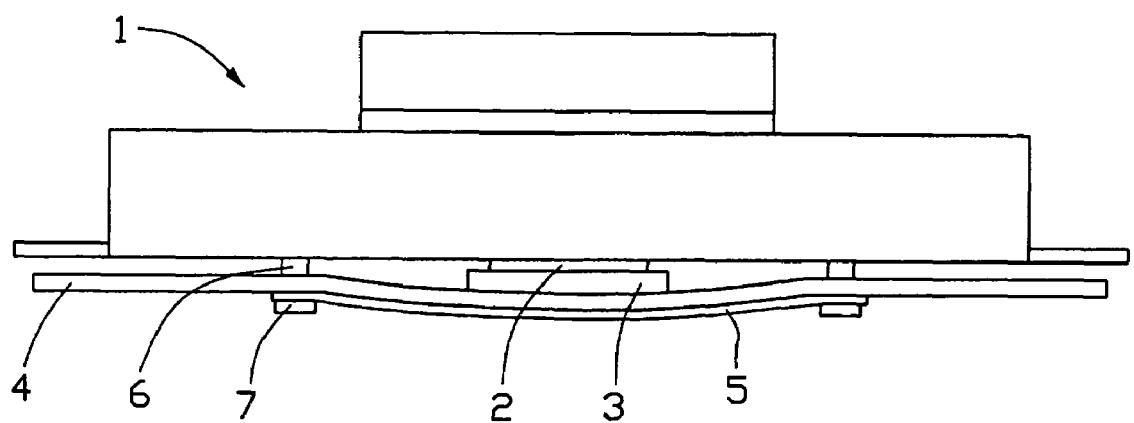
FIG. 6 is similar to FIG. 4, but showing, in an exaggerative manner, a deformation of a printed circuit board of the electronic assembly of FIG. 4.

Referring to FIGS. 1-3, in assembly, the operating portion 326 is raised such that the first piece section 32 and the second piece section 34 are not in line with each other, which means there is an angle between the first piece section 32 and the second piece section 34; the angle is less than 180 degrees. The legs 3202 of the first piece section 32 are then inserted into the corresponding arch bridges 42 of the base plane 40. The legs 3402 of the second piece section 34 spontaneously slide into the corresponding arch bridges 42. The operating portion 326 is pressed downwardly such that the edge 328 of the operating portion 326 abuts against the edge portion 348 of the projecting portion 342, whereby the first piece 32 and the second piece 34 are in line with each other. Simultaneously, the apertures 3206, 3406 of the posts 3204, 3404 are aligned with the locating holes 420 of the arch bridges 42. The PCB 20 with the socket 22 and the CPU 24 is brought to be mounted on the arch bridges 42 of the base plane 40 with the through holes 202 aligned with the locating holes 402 and the apertures 3206, 3406, respectively. The heat sink 10 is attached on the CPU 24 to a position wherein the four fixing holes 102 in the heat sink 10 aligned with the through holes 202. The back plate 30 with the base plane 40 is attached to an underside of the printed circuit board 20 opposite an top side of the PCB 20 on which the CPU 24 is mounted, with the projecting portions 322, 342 of the back plate 30 abutting against the printed circuit board 20. Screws (not shown) are respectively extended through the fixing holes 102 of the heat sink 10, through holes 202 of the PCB 20, locating holes 420 of the arch bridges 42 and respectively threadedly engaged with the internal threads in the apertures 3206, 3406 of the posts 3204, 3404 of the back plate 30. Thus, the electronic assembly is fully assembled with the heat sink 10 thermally engaging with the CPU 24 and the back plate 30 reinforcing the PCB 20. The projection portions 322, 342 resiliently abut against the underside of the printed circuit board 20 at a position generally below a center of the socket 22, the CPU 24 and the heat sink 10, thereby preventing deformation of the printed circuit board 20.

During disassembly of the back plate 30, the screws are disengaged with the posts 3206, 3406. The heat sink 10 and the PCB 20 together with the CPU 24 and socket 22 are removed from the arch bridges 42 of the base plane 40. The operating portion 326 is raised to permit the legs 3202, 3402 of the first piece section 32 and the second piece section 34 out from the arch bridges 42. The back plate 30 is then folded to reduce occupied space thereof. Therefore, the back plate 30 can be more conveniently transported and stored.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. An electronic assembly comprising:
    a printed circuit board;
    a CPU mounted on the printed circuit board;
    a heat sink attached on the CPU; and
    a foldable back plate positioned on an underside of the printed circuit board opposite to the heat sink, the foldable back plate secured with the heat sink and the printed circuit board, the foldable back plate including a pivotably connected portion located below the socket.

2. The electronic assembly of claim 1, wherein the pivotably connected portion has a pivot.

3. The electronic assembly of claim 1, further comprising a base plane assembled to the back plate, the base plane comprising arch bridges having locating holes.

4. The electronic assembly of claim 3, wherein the back plate comprises a plurality of legs, each leg forms a post having an aperture defining an internal thread.

5. The heat electronic assembly of claim 4, wherein the legs are received in the arch bridges, respectively, and the apertures of the posts are aligned with the locating holes of the base plane, respectively.

6. The electronic assembly of claim 1, wherein the back plate comprises a first piece section and a second piece section, the first piece section and the second piece section each comprise a flat base and a projecting portion extending from the base, the projecting portions extending toward each other and being pivotally jointed by a pivot.

7. The electronic assembly of claim 6, wherein the two projecting portions each comprise a contact portion for contacting the underside of the printed circuit board, and a pair of lateral sides perpendicularly extending downwardly from opposite sides of the contact portion.

8. The electronic assembly of claim 7, wherein the contact portion of the first piece section is parallel to the flat base of the first piece section and the contact portion of the second piece section is parallel to the flat base of the second piece section.

9. The electronic assembly of claim 7, wherein the contact portion of the first piece section comprises an operating portion extending horizontally therefrom, the contact portion of the second piece section forms an edge at an end thereof, the operating portion has an edge abutting against the edge of the contact portion of the second piece section.

10. The electronic assembly of claim 7, wherein the pivot engages the lateral sides of the first and second piece sections.

11. An electronic assembly comprising:
    a printed circuit board;
    a CPU seated upon an upper surface of the printed circuit board;
    a heat sink mounted on the CPU;
    a back plate attached on an underside of the printed circuit board to reinforce the printed circuit board, the back plate comprising a first piece section and a second piece section pivotally joined together by a pivot;
    wherein the first and the second piece sections each comprise a flat base portion and a projecting portion extending from the flat base portion, the two projecting portions cooperatively abut against the underside of the printed circuit board.

12. The electronic assembly of claim 11, wherein the two projecting portions each comprise a contact portion for contacting the underside of the printed circuit board, and a pair of lateral sides perpendicularly extending downwardly from opposite sides thereof.

13. The electronic assembly of claim 12, wherein the pivot pivotably connects the lateral sides.

14. The electronic assembly of claim 11, further comprising a base plane assembled to the back plate, the base plane comprising arch bridges having locating holes.

15. The electronic assembly of claim 14, wherein the back plate comprises a plurality of legs, each leg forms a post having an aperture defining an internal thread.

16. The electronic assembly of claim 15, wherein the legs are received in the arch bridges, and the apertures of the posts are aligned with the locating holes of the base plane, respectively.

17. A heat dissipating device comprising:
   a heat sink adapted for contacting an IC package mounted on a printed circuit board;
   a base plane forming a plurality of arch bridges thereon, said arch bridges being adapted for mounting of the printed circuit board thereon;
   a foldable back plate having a plurality of legs for being inserted into the bridges, respectively, and a pivotably connected portion between the legs, the legs being for securing with the arch bridges and the heat sink.

18. The heat dissipating device of claim 17, wherein each of the legs defines an internal thread therein for securing with a corresponding bridge and the heat sink.

19. The heat dissipating device of claim 18, wherein the pivotably connected portion has downwardly extending lateral sides pivotably connected together.

20. The heat dissipating device of claim 19, wherein the pivotably connected portion has two edges abutting against each other.

* * * * *